(12) United States Patent
Cho

(10) Patent No.: US 9,401,389 B2
(45) Date of Patent: Jul. 26, 2016

(54) DISPLAY PANEL AND METHOD OF MANUFACTURING THE SAME

(71) Applicant: Samsung Display Co., Ltd., Yongin, Gyeonggi-Do (KR)

(72) Inventor: Se-Il Cho, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 104 days.

(21) Appl. No.: 14/521,313

(22) Filed: Oct. 22, 2014

(65) Prior Publication Data

US 2015/0236080 A1  Aug. 20, 2015

(30) Foreign Application Priority Data

Feb. 14, 2014  (KR) .......................... 10-2014-0016983

(51) Int. Cl.
*H01L 27/32* (2006.01)
*H01L 51/52* (2006.01)

(52) U.S. Cl.
CPC ........ *H01L 27/3246* (2013.01); *H01L 51/5281* (2013.01)

(58) Field of Classification Search
CPC .................... H01L 2227/323; H01L 27/3246; H01L 51/5281
USPC .......................... 313/498–512, 609, 292, 582
See application file for complete search history.

(56) References Cited

U.S. PATENT DOCUMENTS

| 7,815,479 | B2 * | 10/2010 | Koo ..................... H01L 51/5271 313/506 |
| 7,948,168 | B2 * | 5/2011 | Park ..................... H01L 27/3246 313/292 |
| 9,076,739 | B2 * | 7/2015 | Choi ........................ H01L 27/32 |
| 2005/0133802 | A1 * | 6/2005 | Lee et al. ........................ 257/95 |
| 2005/0139849 | A1 | 6/2005 | Ko |
| 2008/0084160 | A1 | 4/2008 | Hayama |
| 2009/0039773 | A1 * | 2/2009 | Jun et al. ........................ 313/504 |
| 2009/0174320 | A1 * | 7/2009 | Kim ..................... H01L 27/3246 313/504 |
| 2010/0045173 | A1 * | 2/2010 | Kwon ................. H01L 27/3246 313/504 |
| 2010/0213827 | A1 * | 8/2010 | Yoshida et al. ................ 313/504 |
| 2012/0097927 | A1 * | 4/2012 | Shin ................................. 257/40 |

FOREIGN PATENT DOCUMENTS

| JP | 11-231327 A | 8/1999 |
| JP | 2008-097861 A | 4/2008 |
| KR | 10-2008-0016284 A | 2/2008 |

* cited by examiner

Primary Examiner — Donald Raleigh
Assistant Examiner — Kevin Quarterman
(74) Attorney, Agent, or Firm — Knobbe Martens Olson & Bear LLP

(57) ABSTRACT

A display panel and a method of manufacturing the same are disclosed. In one aspect, the display panel comprises a first substrate, a switching element formed over the first substrate, a planarization insulating layer having a via hole that at least partially exposes the switching element, and a light-emitting structure including a first electrode connected to the switching element through the via hole. The display panel also includes a spacer having a trench configured to alter the path of external light reflected off the light-emitting structure, wherein the spacer at least partially covers the first electrode and the planarization insulating layer. The display panel further includes a second substrate formed over the spacer, wherein the spacer is interposed between the first and second substrates.

17 Claims, 14 Drawing Sheets

DISPLAY PANEL AND METHOD OF MANUFACTURING THE SAME

INCORPORATION BY REFERENCE TO ANY PRIORITY APPLICATIONS

This application claims priority under 35 USC §119 to Korean Patent Applications No. 10-2014-0016983, filed on Feb. 14, 2014 in the Korean Intellectual Property Office (KIPO), the contents of which are incorporated by reference herein in its entirety.

BACKGROUND

1. Field

The described technology generally relates to a display panel and a method of manufacturing the display panel.

2. Description of the Related Technology

A display panel (e.g., a liquid crystal display (LCD) panel or an organic light-emitting diode (OLED) display panel) displays an image transformed from an electric signal. The display panel generally includes a first substrate, a second substrate opposite to the first substrate, and a plurality of light-emitting structures. The display panel can further include a spacer that separates the light-emitting structures from each other and protects the light-emitting structures from external impact or pressure. A contact region at which a first electrode of the light-emitting structure is contacted to a switching element can be formed under the spacer. External light can be reflected at the contact region by the first electrode of the light-emitting structure. Accordingly, visibility of the display panel can be reduced due to the reflected light.

SUMMARY OF CERTAIN INVENTIVE ASPECTS

One inventive aspect is a display panel having an improved visibility.

Another aspect is a method of manufacturing a display panel having an improved visibility.

Another aspect is a display panel including a first substrate, a switching element formed on the first substrate, a planarization insulating layer including a via hole that exposes the switching element, a light-emitting structure including a first electrode contacted to the switching element through the via hole, a spacer that includes a trench and covers the first electrode and the planarization insulating layer, and a second substrate that is opposite to the first substrate and formed on the spacer, where the trench can deform a path of an external light and be formed on a contact region at which the switching element is contacted to the first electrode.

In example embodiments, the trench can be formed in the contact region from a top view of the display panel.

In example embodiments, the trench can be formed in a line shape having a predetermined width from the top view of the display panel.

In example embodiments, the width of the trench can be smaller than a width of the contact region.

In example embodiments, the trench can be separated from a boundary line of the contact region by a predetermined distance.

In example embodiments, the trench can be formed in an island shape having a predetermined area from the top view of the display panel.

In example embodiments, the area of the trench can be smaller than an area of the contact region.

In example embodiments, the trench can be dented from a surface of the spacer by a predetermined depth.

Another inventive aspect is a display panel including a first substrate, a switching element formed on the first substrate, a planarization insulating layer including a via hole that exposes the switching element, a light-emitting structure including a first electrode contacted to the switching element through the via hole, a pixel definition layer that surrounds the light-emitting structure and covers the planarization insulating layer and the via hole, a spacer that includes a trench and at least partially covers the pixel definition layer, and a second substrate that is opposite to the first substrate and formed on the spacer, where the trench can deforms a path of an external light and be formed on a contact region at which the switching element is contacted to the first electrode.

In example embodiments, the trench can be formed in the contact region from a top view of the display panel.

In example embodiments, the trench can be formed in a line shape having a predetermined width from the top view of the display panel.

In example embodiments, the trench can be formed to an island shape having a predetermined area from the top view of the display panel.

In example embodiments, the trench can be dented from a surface of the spacer by a predetermined depth.

In example embodiments, the spacer can include a different material from a material of the pixel definition layer.

In example embodiments, the spacer can include the same material as a material of the pixel definition layer.

Another inventive aspect is a method of manufacturing a display panel including a step of forming a switching element on the first substrate, a step of forming a first insulating layer to cover the switching element, a step of etching the first insulating layer to form a via hole that exposes the switching element, a step of forming a first electrode contacted to the switching element through the via hole, a step of forming a second insulating layer to cover the via hole, the first electrode and the first insulating layer, a step of etching the second insulating layer to form a spacer including a trench that deforms a path of an external light and is formed on a contact region at which the switching element is contacted to the first electrode, a step of forming a light-emitting layer contacted to the first electrode, a step of forming a second electrode contacted to the light-emitting layer, and a step of bonding a second substrate to the first substrate, the second substrate being formed on the spacer.

In example embodiments, the step of forming the spacer can include a step of disposing a half-tone mask on the second insulating layer, the half-tone mask including a block region, a transmission region and a half-transmission region, a step of patterning the second insulating layer by irradiating a light to the second insulating layer through the half-tone mask, and a step of etching the second insulating layer.

In example embodiments, the step of patterning the second insulating layer can include a step of irradiating a defocusing light on the second insulating layer, a focal point of the defocusing light being apart from the second insulating layer by a predetermined distance.

In example embodiments, the trench can be formed in a line shape having a predetermined width from a top view of the display panel.

In example embodiments, the trench can be formed in an island shape having a predetermined area from the top view of the display panel.

Another aspect is a display panel comprising a first substrate, a switching element formed over the first substrate, a planarization insulating layer having a via hole that at least partially exposes the switching element, a light-emitting structure including a first electrode connected to the switching element through the via hole, and a spacer having a trench configured to alter the path of external light reflected off the light-emitting structure, wherein the spacer at least partially covers the first electrode and the planarization insulating layer. The display panel also comprises a second substrate formed over the spacer, wherein the spacer is interposed between the first and second substrates.

In the above display panel, the trench is formed in a contact region in which the switching element contacts the first electrode. In the above display panel, the trench is substantially linear and has a predetermined width. In the above display panel, the width of the trench is less than the width of the contact region. In the above display panel, the trench is located a predetermined distance away from a boundary line of the contact region, wherein the boundary line is formed between the trench and the remaining portion of the spacer.

In the above display panel, the trench is formed in an island shape having a predetermined area when viewed from the light-emitting side of the display panel. In the above display panel, the area of the trench is smaller than the area of the contact region when viewed from the light-emitting side of the display panel.

In the above display panel, the trench is dented from a surface of the spacer by a predetermined depth and does not expose the first electrode.

Another aspect is a display panel comprising a first substrate, a planarization insulating layer formed over the first substrate and including a via hole, a light-emitting structure including a first electrode, a spacer formed over portion of the light-emitting structure, wherein a trench is defined in the spacer, and a second substrate formed over the spacer.

The above display panel further comprises a switching element formed over the first substrate, wherein the first electrode contacts the portion, and wherein the trench is formed in a contact region in which the first electrode contacts the portion. In the above display panel, the trench is substantially linear and has a predetermined width.

In the above display panel, the trench is formed in an island shape having a predetermined area when viewed from the light-emitting side of the display panel.

In the above display panel, the trench is dented from a surface of the spacer by a predetermined depth and does not expose the first electrode.

The above display panel further comprises a pixel definition layer substantially surrounding the light-emitting structure, wherein the spacer and the pixel definition layer are formed of different materials.

The above display panel further comprises a pixel definition layer substantially surrounding the light-emitting structure, wherein the spacer and the pixel definition layer are formed of the same material.

Another aspect is a method of manufacturing a display panel, the method comprising forming a switching element over the first substrate, forming a first insulating layer at least partially covering the switching element, etching the first insulating layer so as to form a via hole that at least partially exposes the switching element, forming a first electrode connected to the switching element through the via hole in a contact region, and forming a second insulating layer at least partially covering the via hole, the first electrode and the first insulating layer. The method further comprises etching the second insulating layer so as to form a spacer having a trench configured to alter the path of external light reflected off first electrode and formed over the contact region, forming a light-emitting layer connected to the first electrode, forming a second electrode connected to the light-emitting layer, and bonding a second substrate to the first substrate, wherein the spacer is interposed between the first and second substrates.

In the above method, the forming of the spacer includes disposing a half-tone mask over the second insulating layer, wherein the half-tone mask includes a non-transmission region, a transmission region, and a half-transmission region. In the above method, the forming of the spacer further includes irradiating light to the second insulating layer through the half-tone mask so as to pattern the second insulating layer, and etching the patterned second insulating layer.

In the above method, the irradiating includes irradiating a defocusing light to the second insulating layer, wherein a focal point of the defocusing light is apart from the second insulating layer by a predetermined distance.

In the above method, the trench is substantially linear and has a predetermined width.

In the above method, the trench is formed in an island shape having a predetermined area when viewed from the light-emitting side of the second substrate.

Therefore, a display panel according to example embodiments can include a trench deforming a path of an external light. The trench can be formed in a contact region to deform the path of the external light incident to the contact region, and can prevent a reflection of the external light which is reflected by a first electrode of the light-emitting structure at the contact region. Accordingly, a visibility of the display panel can be improved.

Further, a method of manufacturing a display panel according to example embodiments can easily form a trench preventing a reflection of an external light by using a half-tone mask. Accordingly, the display panel having improved visibility can be manufactured by the method.

DETAILED DESCRIPTION OF CERTAIN INVENTIVE EMBODIMENTS

Figure 1:
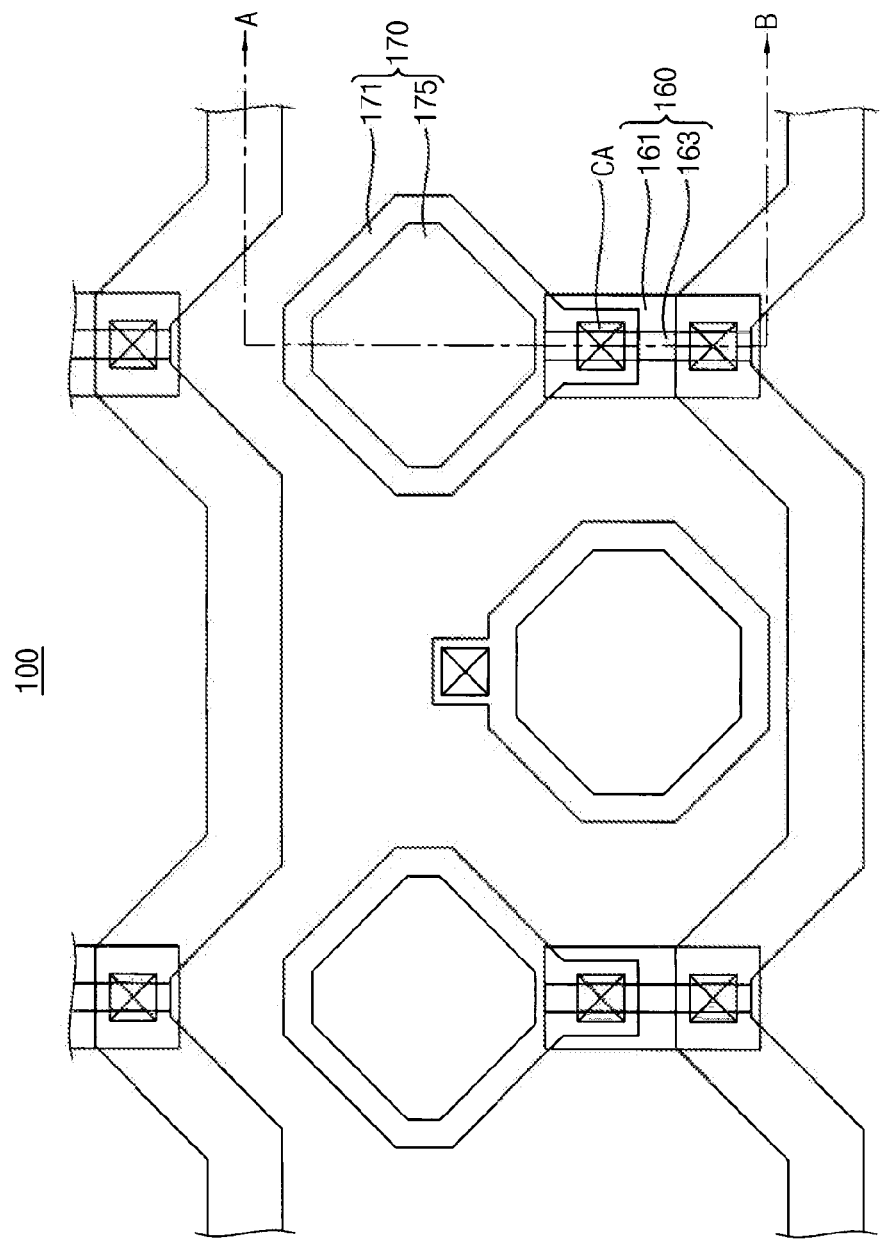
FIG. 1 is a plan view illustrating a display panel according to example embodiments.

Various example embodiments will be described more fully hereinafter with reference to the accompanying drawings, in which some example embodiments are shown. The present inventive concept can, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions can be exaggerated for clarity. Like numerals refer to like elements throughout.

It will be understood that, although the terms first, second, third etc. can be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In this disclosure, the term "substantially" includes the meanings of completely, almost completely or to any significant degree under some applications and in accordance with those skilled in the art. Moreover, "formed on" can also mean "formed over."

Figure 2:
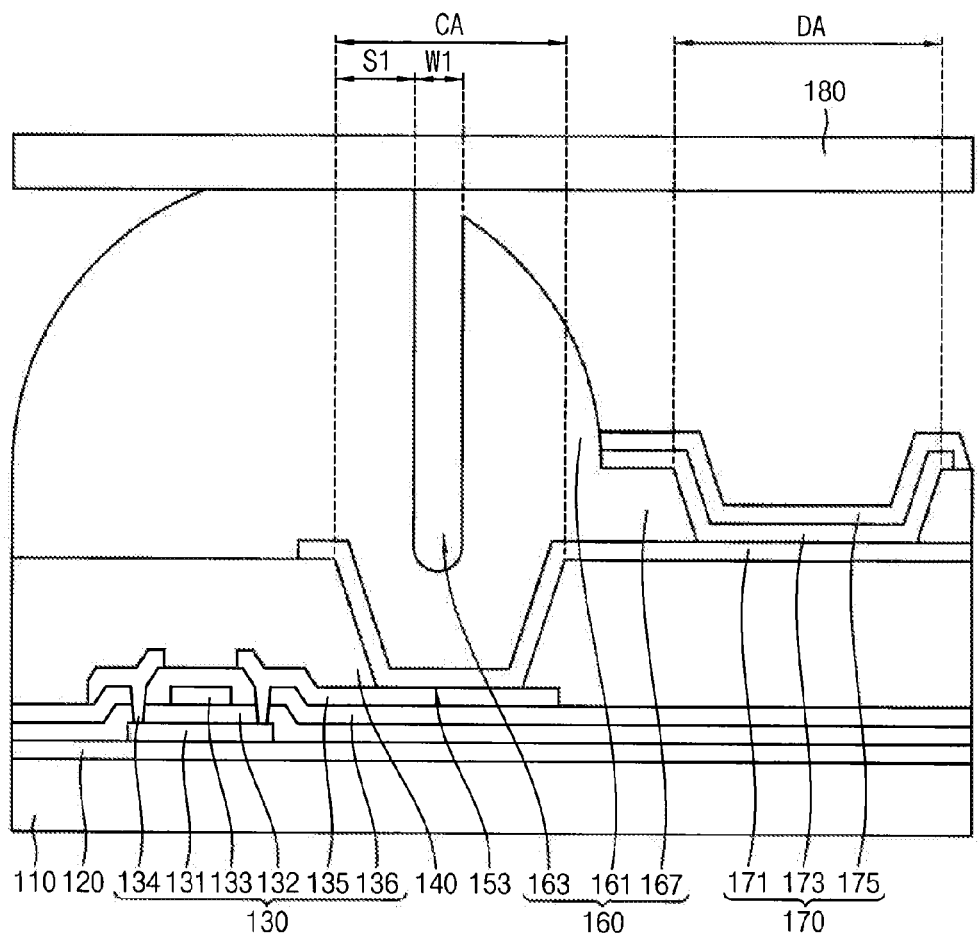
FIG. 2 is a cross-sectional view taken along a line A-B in the display panel of FIG. 1.

FIG. 1 is a plan view illustrating a display panel according to example embodiments. FIG. 2 is a cross-sectional view taken along a line A-B of display panel of FIG. 1.

Referring to FIGS. 1 and 2, the display panel 100 includes a first substrate 110, a switching element 130, a light-emitting structure 170, a spacer 160 and a second substrate 180.

The display panel 100 is a panel displaying an image based on an electric signal. For example, the display panel can serve as a liquid crystal display panel, an organic light-emitting diode (OLED) display panel, a plasma display panel (PDP), an electrophoretic display panel (EPD), or electrowetting display panel (EWD) according to a displaying type. Further, the display panel 100 can serve as a flat panel display, a rounded display panel or a flexible display panel according to an appearance of the display panel. For convenience, an OLED display panel 110 is illustrated in FIGS. 1 and 2.

The switching element 130 and the light-emitting structure 170 can be formed on the first substrate 110. The first substrate 110 can be a glass substrate or a plastic substrate so as to maintain physical toughness and chemical stability. If the first substrate 110 is the glass substrate, the first substrate 110 can be formed of silicon oxide (SiOx). If the first substrate 110 is the plastic substrate, the first substrate 110 can be formed of polyacrylate (PAR), polyetherimide (PEI), polyethylen terephthalate (PET), polyethylen naphthalate (PEN), polyphenylene sulfide (PPS), Polyimide, polycarbonate (PC), etc.

The switching element 130 can be formed on the first substrate 110 and can transmit an electric signal to the light-emitting structure 170. For example, the switching element 130 can be a thin film transistor (TFT) including a gate electrode 133, a source electrode 134 and a drain electrode 135. As an example embodiment, the TFT, the switching element 130, is illustrated in FIG. 2. As illustrated in FIG. 2, a semiconductor layer 131 can be formed on the first substrate 110. In example embodiment, a buffer layer 120 can be formed on the first substrate 110 and the semiconductor layer 131 can be formed on the buffer layer 120. The buffer layer 120 can block a permeation of impurities and reduce stress generated during a forming process for the switching element 130. The semiconductor layer 131 can serve as an active layer of the switching element 130. For example, when a gate voltage is applied to the gate electrode 133, a channel is formed in the semiconductor layer 131 and the electric signal can be transmitted from the source electrode 134 to the drain electrode 135. The semiconductor layer 131 can be formed of polysilicon, polysilicon having impurity, an amorphous silicon, an amorphous silicon having impurity, an oxide silicon, an oxide silicon having impurity, etc. A gate insulation layer 132 can at least partially cover the semiconductor layer 131. The gate insulation layer 132 can be formed of an oxide, an organic insulating material, etc. The gate electrode 133 can at least partially overlap the semiconductor layer 131. The gate electrode 133 can be formed of a metal, a conductive metal nitride, a conductive metal oxide, a transparent conductive material, etc. The channel can be formed at a portion where the gate electrode 133 overlaps the semiconductor layer 131. An insulating interlayer 136 can at least partially cover a gate electrode 133 and the gate insulation layer 132. The insulating interlayer 136 can prevent other portions from etching during a forming process for the source and drain electrodes 134 and 135. The insulating interlayer 136 can be formed of an oxide, a nitride, an oxynitride, an organic insulating material, etc. The source and drain electrodes 134 and 135 can be formed on the insulating interlayer 136. The source and drain electrodes 134 and 135 can contact the semiconductor layer 131. When the gate voltage is applied to the gate electrode 133, the electric signal can be transmitted from the source electrode 134 to drain electrode 135. Each of the source and drain electrodes 134 and 135 can be formed of a metal, a conductive metal nitride, a conductive metal oxide, a transparent conductive material, etc.

The planarization insulating layer 140 can at least partially cover the switching element 130. The planarization insulating layer 140 can have a substantially flat upper surface. Accordingly, an upper surface of the switching element 130 can flatten (i.e., planarized). In example embodiments, the planarization insulating layer 140 can have a substantially flat surface formed by planarizing process (e.g., a chemical mechanical polishing (CMP) process, etch-back process, etc). In example embodiments, the planarization insulating layer 140 can be formed of a material having a self-planarizing property. The planarization insulating layer 140 can be formed of a transparent insulating material such as a transparent plastic, a transparent resin, etc. For example, the planarization insulating layer 140 can be formed of a benzocyclobutene (BCB)-based resin, an olefin-based resin, a polyimide-based resin, an acryl-based resin, a polyvinyl-based resin, a siloxane-based resin, etc. These can be used alone or in combination thereof.

In example embodiments, the planarization insulating layer 140 can include a via hole 153 which exposes the switching element 130. For example, the via hole 153 can expose the drain electrode 135. The switching element 130 can electrically connect to the light-emitting structure 170 through the via hole 153. For example, a first electrode 171 of the light-emitting structure 170 can be contacted to the drain electrode 135 through the via hole 153. A contact region CA at which the first electrode 171 is contacted to the drain electrode 135 can be formed. The contact region CA can be formed in various shapes from a top view of the display panel 100. For example, as illustrated in FIG. 1, the contact region CA can be formed in a quadrangular shape from the top view. However, the shape of the contact region CA is not limited thereto. The contact region CA can be formed in a circular shape, an elliptical shape or a polygonal shape.

The light-emitting structure 170 can be formed on the planarization insulating layer 140. In example embodiments, the light-emitting structure 170 can be an OLED. The light-emitting structure 170 can serve as a pixel of the display panel 100. For example, the pixel can include a red light-emitting diode (LED), a green light-emitting diode and a blue light-emitting diode. The light-emitting structure 170 can include the first electrode 171, a light-emitting layer 173 and a second electrode 175.

The first electrode 171 can provide electric charges for the light-emitting layer 173. For example, the first electrode 171 can serve as an anode providing holes for the light-emitting layer 173. The first electrode 171 can serve as a reflective electrode or a transmitting electrode according to a light-emitting type of the light-emitting structure 170. If the first electrode 171 is the reflective electrode, the first electrode 171 can be formed of aluminum (Al), silver (Ag), gold (Au), platinum (Pt), chrome (Cr), tungsten (W), molybdenum (Mo), titanium (Ti), palladium (Pd) or an alloy thereof. In some embodiments, the first electrode 171 can be contacted to the drain electrode 135. For example, the first electrode 171 can directly contact the drain electrode 135 through the via hole 153. For example, the first electrode 171 can be electrically connected to the drain electrode 135 through a conductive member filling the via hole 153.

The light-emitting layer 173 can formed between the first electrode 171 and the second electrode 175, and can emit a light having a specific wavelength. For example, the light-emitting layer 173 can emit red, green, blue or white light. The light-emitting layer 173 can be contacted to the first electrode 171 at a predetermined region. For example, as illustrated in FIG. 2, the light-emitting layer 173 can be contacted to the first and second electrodes 171 and 175 at a pixel region DA. The light-emitting layer 173 can emit the light by receiving holes and electrons from the first electrode 171 and the second electrode 175 respectively. The light-emitting layer 173 can be formed of an organic material emitting the light based on combination energy of the electrons and holes. For example, the light-emitting layer 173 can include a light-emitting host (e.g., tris(8-hydroxyquinolinato)aluminum (Alq3), 9,10-Di(2-naphyl)anthracene (ADN), 3-tert-butyl-9, 10-Di(2-naphyl)anthracene (TBADN), etc) and a light-emitting dopant (e.g., octaethylporphine (PtOEP), tris[1-phenyl-isoquinoline-C2,N]iridium(3) (Ir(piq)3), tris[2-phenylpyridinato-C2,N]iridium(3) (Ir(ppy)3), acetylacetonate bis(2-phenylpyridine)iridium (Ir(ppy)2(acac)), bis[2-(4,6-difluorophenyl)pyridinato-C2,N](picolinato)iridium(III) (F2Irpic), bis(4',6'-difluorophenylpyridinato)(3-trip (Ir(dfppz)3), etc). In example embodiments, the light-emitting layer 173 can further include an organic layer facilitating a combination of the electrons and the holes. For example, the light-emitting layer 173 can further include a hole injection layer, a hole transport layer, an electron transport layer, an electron injection layer etc.

The second electrode 175 can provide electric charges for the light-emitting layer 173. For example, the second electrode 175 can serve as a cathode providing electrons for the light-emitting layer 173. The second electrode 175 can serve as a reflective electrode or a transmitting electrode according to a light-emitting type of the light-emitting structure 170. For example, the second electrode 175 can serve as a transmitting electrode. The second electrode 175 can be formed of a transparent conductive material (e.g., indium tin oxide (ITO), indium zinc oxide (IZO), aluminum zinc oxide (AZO), tin oxide (SnOx), indium oxide (InOx), gallium oxide (GaOx), etc). These can be used alone or in combination thereof.

The second substrate 180 can oppose the first substrate 110, and can at least partially cover the light-emitting structure 170. The second substrate 180 can be formed of a glass or a transparent plastic so as to protect the light-emitting structure 170 from an external environment and to easily transmit a light emitted from the light-emitting structure 170. In example embodiments, the second substrate 180 can have a coefficient of thermal expansion similar to that of the first substrate 110. If the second substrate 180 has a similar coefficient of thermal expansion to that of the first substrate 110, detachment of the second substrate 180 from the first substrate 110 can be prevented even though a heat treatment is performed.

The spacer 160, the via hole 153 and the first electrode 171 can be formed between the first substrate 110 and the second substrate 180 so as to cover the planarization insulating layer 140. In example embodiments, the spacer 160 can be formed of an insulating material. For example, the spacer 160 can be formed of an organic material (e.g., a polyacryl-based resin, an epoxy-based resin, a phenol-based resin, a polyamide-based resin, a polyimide-based resin, an unsaturated polyester-based resin, a polyphenylene-based resin, a poly(phenylenesulfide)-based resin, BCB, etc), or an inorganic material (e.g., silicon oxide, silicon nitride, silicon oxynitride, etc).

The spacer 160 can separate the second substrate 180 from the light-emitting structure 170. If the spacer 160 is not formed, the second substrate 180 can directly contact the light-emitting structure 170, and the light-emitting structure 170 can be damaged by external impact or pressure. For example, the external impact can be applied to the second substrate 180 while the second substrate 180 is bonded to the first substrate 110. The external impact on the second substrate 180 can be transmitted to the light-emitting structure 170 contacted to the second substrate 180, and the light-emitting structure 170 can be damaged by a transmitted impact. However, when the spacer 160 is formed, the second substrate 180 can be separated from the light-emitting structure 170, and the light-emitting structure can be prevented from damage. The spacer 160 can include a protrusion portion 161 separating the second substrate 180 from the light-emitting structure 170, a pixel definition portion 167 surrounding the light-emitting structure 170, and a trench 163 deforming or altering a path of external light reflected off the light-emitting structure.

The pixel definition portion 167 can form a pixel region DA by surrounding the light-emitting structure 170. The display panel 100 can include a plurality of light-emitting structures 170. The light-emitting structures 170 can be formed by one process. For example, a plurality of pixel regions DA can be formed by the pixel definition portion 167, and the light-emitting structures 170 can be formed substantially simultaneously at the pixel regions DA. In example embodiments, the pixel definition portion 167 can have a height lower than that of the protrusion portion 161. For example, as illustrated in FIG. 2, the protrusion portion 161 can be formed to be contacting the second substrate 180, and the pixel definition portion 167 can be formed to have a height lower than that of the protrusion portion 161.

The protrusion portion 161 can protrude from a surface of the planarization insulating layer 140 toward the second substrate 180. In some embodiments, the display panel 100 can include a plurality of protrusion portions 161, and the protrusion portions 161 can be separated from the light-emitting structures 170 by predetermined intervals. For example, if the protrusion portions 161 are separated from the light-emitting structures 170 by relatively large intervals, the second substrate 180 can sag between the protrusion portions 161 toward the first substrate 110. The sagging second substrate 180 can contact the light-emitting structure 170. Accordingly, the protrusion portions 161 separated from the light-emitting structure 170 by the large intervals do not effectively protect the light-emitting structure 170 from the external impact or pressure. On the other hand, if the protrusion portions 161 are separated from the light-emitting structures 170 by relatively small intervals, the protrusion portions 161 can block the light emitted from the light-emitting structures 170. Therefore, the protrusion portions 161 can be separated from the light-emitting structures 170 by suitable intervals. In some embodiments, the protrusion portions 161 protruding from the first substrate 110 can have a gradual slope, as illustrated in FIG. 2. If the protrusion portions 161 have a steep slope, the protrusion portions 161 can be twisted or bent by deformation of the first and second substrates 110 and 180 during an adhesion (i.e., bonding) process of the first substrate 110 and the second substrate 180. Twisted or bent protrusion portions 161 can form a shade at least partially shading the light-emitting structures 170. Accordingly, a visibility of the display panel 100 can be degraded. To prevent the degradation, the protrusion portions 161 can have a gradual slope. For example, the protrusion portions 161 can have a hemisphere shape. Accordingly, in some embodiments, the protrusion portions 161 do not shade the light-emitting structures 170, although the protrusion portions 161 are twisted or bent during the adhesion process.

The trench 163 can minimize a reflection of the external light by deforming the path of the external light. For example, if the trench 163 is not formed, the external light can be reflected by the first electrode 171 at the contact region CA at which the first electrode 171 is contacted to the switching element 130. Because the contact region CA is adjacent to the pixel region DA, the visibility can be degraded by the reflection of the external light at the contact region CA. However, if the trench 163 is formed, the trench 163 can minimize the reflection of the external light, and can improve the visibility of the display panel 100. The trench 163 can be formed from a surface of the protrusion portion 161 by a predetermined depth. The path of the external light can be deformed by refraction in the trench 163. Because a refractive index of an inner space of trench 163 is different from a refractive index of an inner space of the protrusion portion 161, the path of the external light can be deformed by the trench 163. The predetermined depth of the trench 163 is not limited. However, if the depth of the trench 163 is relatively deep, the first electrode 171 can be exposed by the trench 163. Accordingly, the trench 163 can be dented so as to not expose the first electrode 171.

In some embodiments, the trench 163 can be formed in the contact region CA from a top view of the display panel 100, as illustrated in FIG. 1. Further, the trench 163 can be formed in the contact region CA from a cross-sectional view of the display panel 100, as illustrated in FIG. 2. The reflection of the external light can occur frequently at the contact region CA. As described above, a first electrode 171 can be electrically connected to the switching element 130 through the via hole 153 that has a predetermined slope at the contact region CA. For example, the first electrode 171 can be electrically connected to the switching element 130 by filling the via hole 153, and the first electrode 171 can have a predetermined slope along the slope of the via hole 153. Because the first electrode 171 has a relatively high reflectivity as a reflective electrode, the external light can be reflected by an inclined plane of the first electrode 171. However, the trench 163 can deform the path of the external light incident from an external to the via hole 153, so that the trench 163 can prevent the reflection of the external light. In some embodiments, the trench 163 can be substantially linear, or have a linear shape, and have a predetermined width W1 from the top view of the display panel 100. For example, the spacer 160 can cover two via holes 153, and the line can be formed to pass the two via holes 153. Accordingly, the trench 163 covering the two via holes 153 can be formed by one etching step, and the reflection of the external light can be minimized. The width W1 can be less than the width of the contact region CA. For example, the trench 163 can have a width W1 less than about 3 micrometer (μm). If the width W1 is greater than 3 μm, the trench 163 can serve as an opening, and the protrusion portion 161 can crumble or be twisted.

Figure 3:
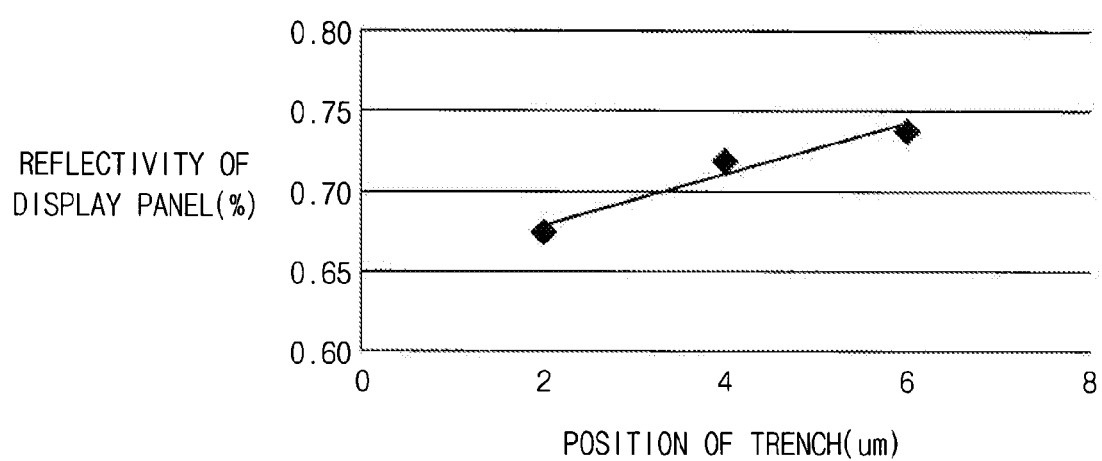
FIG. 3 is a graph illustrating a variation of a reflectivity of the display panel of FIG. 1 according to a position of a trench in a spacer of the display panel of FIG. 1.

FIG. 3 is a graph illustrating a variation of a reflectivity of the display panel of FIG. 1 according to a position of a trench in a spacer of the display panel of FIG. 1.

Referring to FIG. 3, the trench 163 can be separated from a boundary line of the contact region CA by a predetermined distance. For example, as illustrated in FIG. 2, the trench 163 can be separated from the boundary line of the contact region CA by a first distance S1. The path of the external light can be deformed differently according to a position of the trench 163. Accordingly, the reflectivity of the display panel 100 can be changed according to the position of the trench 163. Herein "the reflectivity" means an intensity ratio for a reflected light to an incident light. In some embodiments, the first distance S1 can be a distance ranging from about 2 μm to about 6 μm. The trench 163 can be separated from the boundary line by the distance ranging from about 2 μm to about 6 μm. If the trench 163 is separated from the boundary line by a distance less than 2 μm, the reflectivity of the display panel 100 can be increased. If the trench 163 is separated from the boundary line by a distance greater than about 6 μm, the trench 163 can be formed outside the contact region CA, so that the path of the external light is not deformed sufficiently. As illustrated in FIG. 3, when the trench 163 is separated from the boundary line by about 2 μm, the reflectivity can be reduced to about 0.67%. In other words, the reflectivity can be reduced to about 1/10 of the reflectivity when the spacer 160 does not include the trench 163. Accordingly, when the trench 163 is formed in a contact region CA, the reflectivity can be effectively reduced. However, depending on embodiments, the distance between the trench 163 and the boundary line can be less than about 2 μm or greater than about 6 μm.

Figure 4:
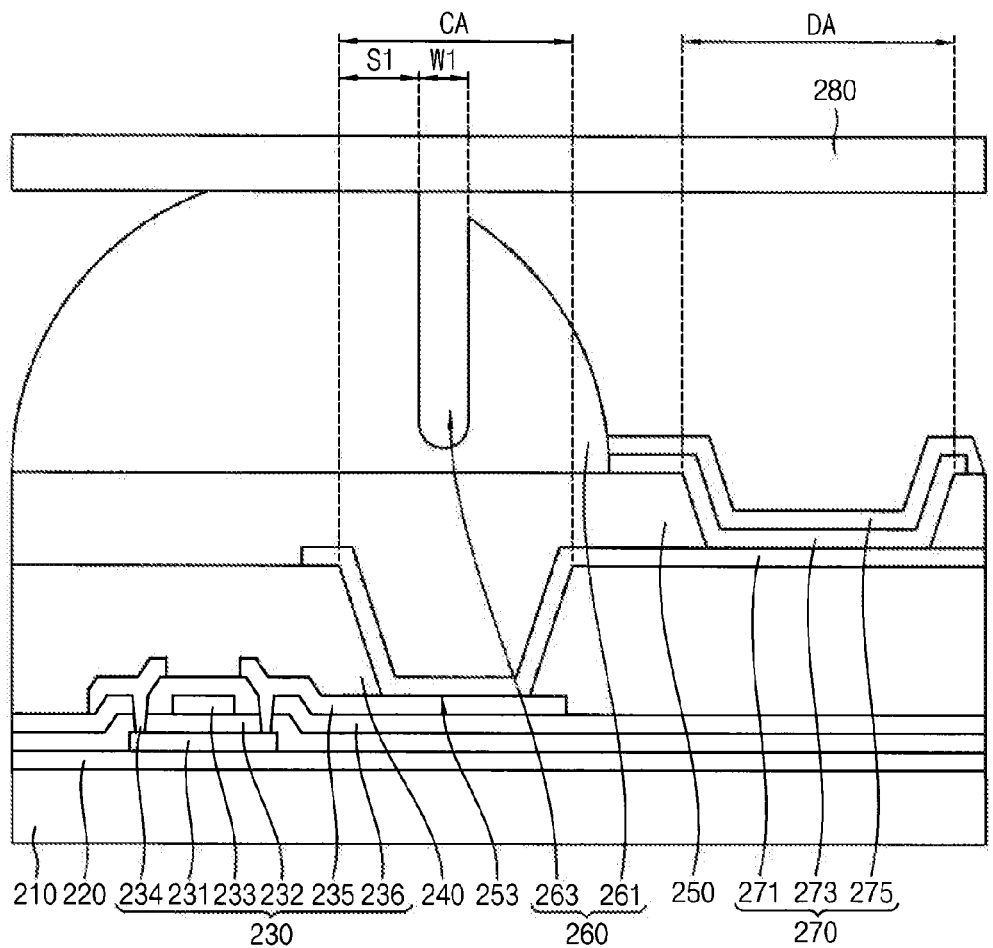
FIG. 4 is a cross-sectional view illustrating a display panel according to example embodiments.

FIG. 4 is a cross-sectional view illustrating a display panel according to example embodiments.

Referring to FIG. 4, the display panel 200 can include a first substrate 210, a switching element 230 on the first substrate 210, a planarization insulating layer 240 at least partially covering the switching element 230, a light-emitting structure 270 electrically connected to the switching element 230, a pixel definition layer 250 surrounding the light-emitting structure 270, a spacer 260 at least partially covering the pixel definition layer 250, and a second substrate 280 opposite to the first substrate 210. Because the first substrate 210, the switching element 230, the planarization insulating layer 240, the light-emitting structure 270 and the second substrate 280 of the display panel 200 are substantially same as the first substrate 110, the switching element 130, the planarization insulating layer 140, the light-emitting structure 170 and the second substrate 180 of the display panel 100 described with reference of FIGS. 1 and 2, duplicated descriptions thereof will not be repeated.

The pixel definition layer 250 can cover a via hole 253 and the planarization insulating layer 240, and can surround a plurality of light-emitting structures 270. For example, the display panel 200 can include a plurality of light-emitting structures 270, and the light-emitting structures 270 can be formed by one process. The pixel definition layer 250 can separate the light-emitting structures 270 from each other. In some embodiments, the pixel definition layer 250 can separate the light-emitting structures 270 from each other by surrounding the light-emitting structures 270 respectively. For example, the pixel definition layer 250 can be a wall structure forming a pixel region DA, and can cover all regions except for the pixel region DA. The light-emitting structures 270 can be formed at the pixel region DA. In some embodiments, the pixel definition layer 250 can be formed of a material different from that of the spacer 260. For example, the pixel definition layer 250 can be formed of an organic insulating material or an inorganic insulating material different from that of the spacer 260. Accordingly, the spacer 260 can be formed on the pixel definition layer 250 after forming the pixel definition layer 250. In some embodiment, the pixel definition layer 250 can be formed of substantially the same material as that of the spacer 260. Accordingly, the spacer 260 and the pixel definition layer 250 can be formed substantially simultaneously using the same insulating material.

The spacer 260 can at least partially cover the pixel definition layer 250, and can be formed between the first substrate 210 and the second substrate 280. The spacer 260 can separate the light-emitting structures 270 from the second substrate 280. The spacer 260 can include a protrusion portion 261 separating the second substrate 280 from the light-emitting structures 270, and a trench 263 deforming a path of an external light.

The protrusion portion 261 can protrude from a surface of the pixel definition layer 240 toward the second substrate 280. In some embodiments, display panel 200 can include a plurality of protrusion portions 261. The protrusion portions 261 can be respectively separated from the light-emitting structures 270 by suitable intervals. In example embodiments, the protrusion portions 261 protruding from the pixel definition layer 250 can have a gradual slope. For example, the protrusion portions 261 can be formed to have a hemisphere shape. Accordingly, in some embodiments, the protrusion portions 261 does not shade the light-emitting structures 270, although the protrusion portions 261 are twisted or bent during the adhesion process (i.e., bonding process) of the first substrate 210 and the second substrate 280.

The trench 263 can minimize a reflection of an external light by deforming the path of the external light. The trench 263 can be dented from a surface of the protrusion portion 261 by a predetermined depth. The path of the external light can be deformed by refraction in the trench 263. Since refractive index of an inner space of trench 263 is different from the refractive index of an inner space of the protrusion portion 261, the path of the external light can be deformed by the trench 263. The predetermined depth of the trench 263 is not limited. For example, the trench 263 can at least partially dent the pixel definition layer 250. However, if the depth of the trench 263 is relatively deep, the first electrode 271 can be exposed by the trench 263. Accordingly, the trench 263 can be dented not to expose the first electrode 271.

In example embodiments, the trench 263 can be formed in the contact region CA from a top view of the display panel 200. Further, the trench 263 can be formed in the contact region CA from a cross-sectional view of the display panel 200. As described above, the external light can be reflected by the first electrode 271 of the light-emitting structure 270 at the via hole 253, so that the trench 263 can be formed in the contact region CA to deform the path of the external light incident to the via hole 253.

Figure 5:
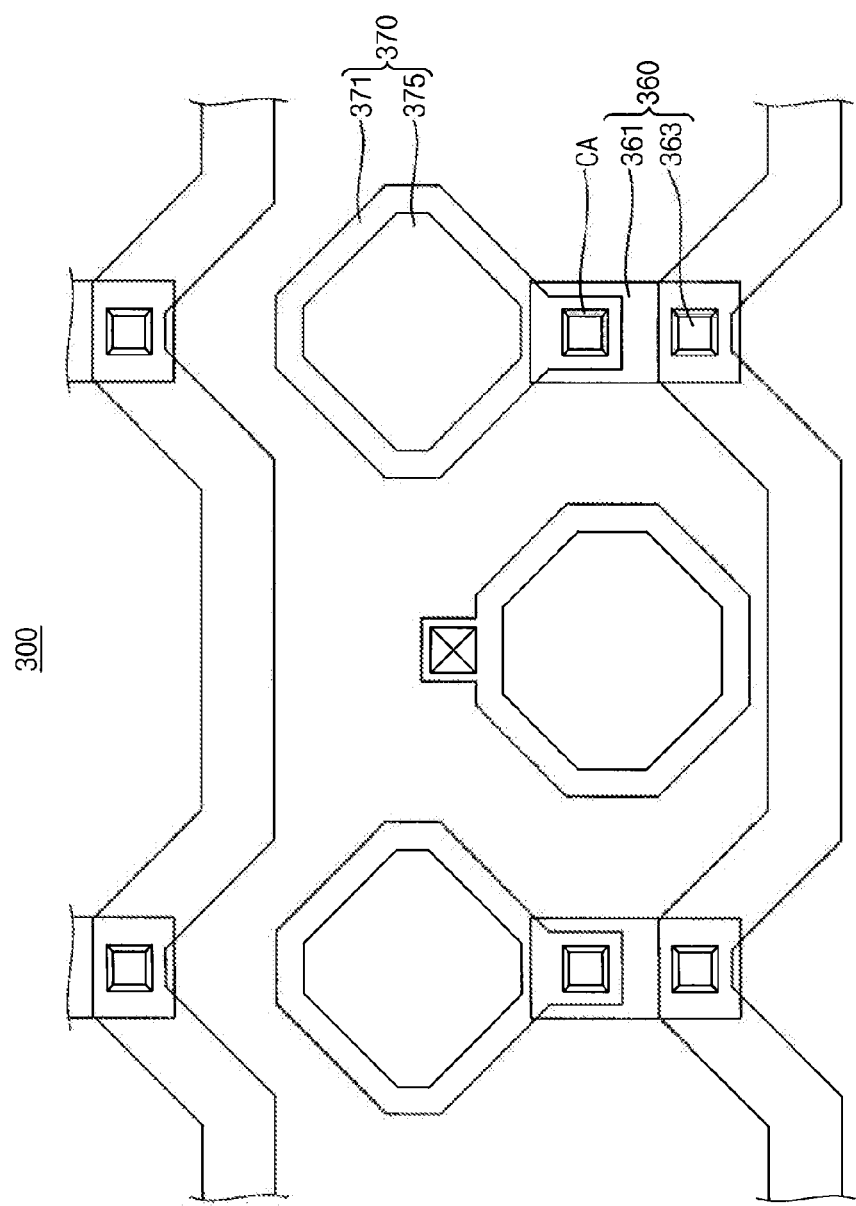
FIG. 5 is a plan view illustrating a display panel according to example embodiments.

FIG. 5 is a plan view illustrating a display panel according to example embodiments.

Referring to FIG. 5, the display panel 300 can include a light-emitting structure 370 and a spacer 360. Since every element of the display panel 300 except for the spacer 360 are substantially same as that of the display panel 100 described with reference of FIGS. 1 and 2, duplicated descriptions thereof will not be repeated.

The spacer 360 can include a protrusion portion 361 and a trench 363. The protrusion portion 361 can be formed adjacent to the light-emitting structure 370, and can separate the second substrate from the light-emitting structure 370. The protrusion portion 361 can be formed on a pixel definition layer or a planarization insulating layer, and can protrude from a surface of the pixel definition layer or the planarization insulating layer toward the second substrate. In some embodiments, the protrude portion 361 can have a gradual slope, and can prop the second substrate to be separated from the light-emitting structure 370.

The trench 363 can be formed in a contact region CA from a top view of the display panel 300. Further, the trench 363 can be formed in the contact region CA from a cross-sectional view of the display panel 300. As described above, an external light can be easily reflected by a first electrode 371 at the contact region CA, so that the trench 363 can be formed in the contact region CA to deform the path of the external light incident to the via hole. If the trench 363 is formed outside of the contact region CA, in some embodiments, the trench 363 does not sufficiently deform the path of the external light, so that the reflectivity of the display panel 300 is not reduced. In some embodiments, the trench 363 can have an island shape dented by a predetermined depth from the top view of the display panel 300, as illustrated in FIG. 5. A shape of the trench 363 is not limited. For example, the trench 363 can be formed in a polygonal shape substantially the same as that of the contact region CA, a circular shape or an elliptical shape. An area of the trench 363 can be less than that of the contact region CA. For example, when the contact region CA has a quadrangular shape having an area that is about 5 $\mu$m*5 $\mu$m, the trench 363 can have a quadrangular shape having an area that is about 1 $\mu$m*1 $\mu$m.

As described above, the display panel 100, 200 and 300 can respectively include spacers 160, 260 and 360 having trenches 163, 263 and 363 which deform the path of an external light. The trench 163, 263 and 363 can be formed in a contact region CA to deform the path of the external light incident to the contact region CA, so that a reflection of the external light which occurs by a first electrode 171 and 271 electrically connected to the switching element 130 and 230 at the contact region CA can be reduced. Therefore, the reflectivity of the display panel 100, 200 and 300 can be reduced and the visibility of the display panel 100, 200 and 300 can be improved.

Figure 6:
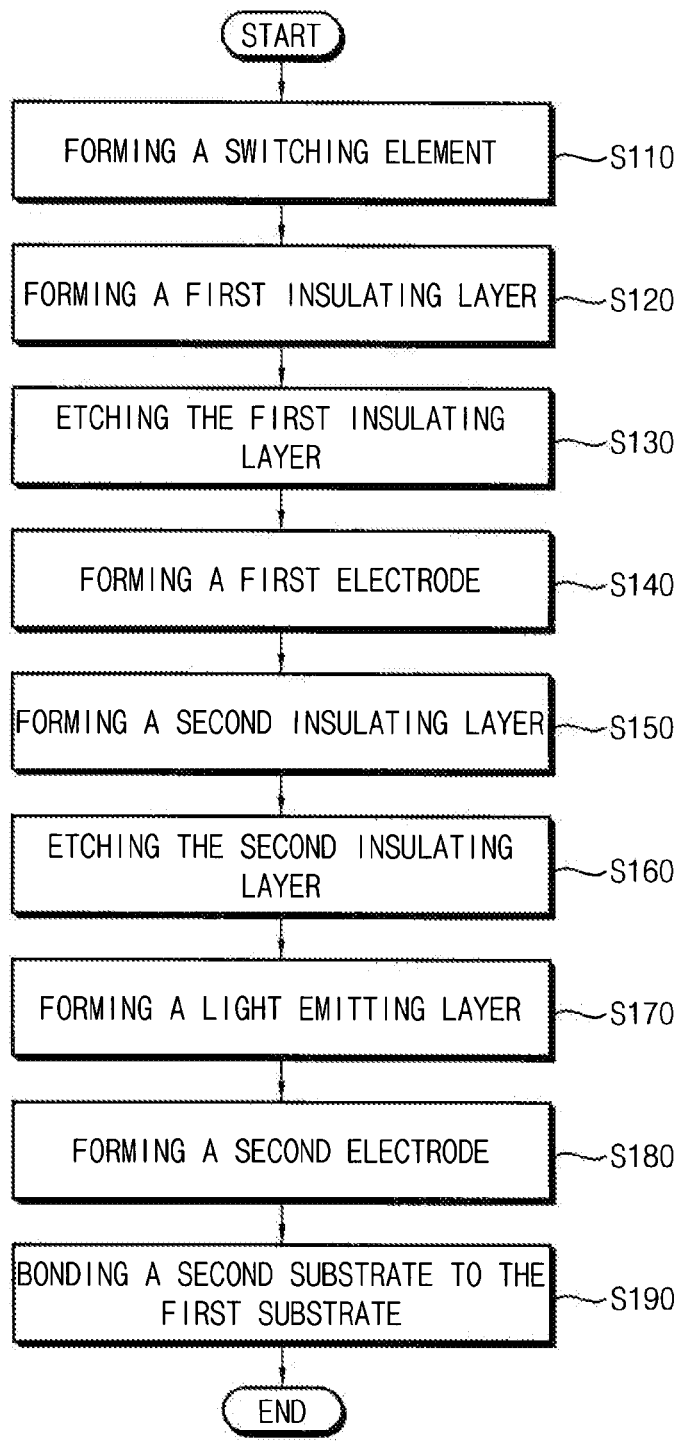
FIG. 6 is a flow chart illustrating a method of manufacturing a display panel according to example embodiments.

FIG. 6 is a flow chart illustrating a method of manufacturing a display panel according to example embodiments. FIGS. 7 through 16 are cross-sectional views illustrating an example of the display panel manufactured by the method of FIG. 6.

Referring to FIGS. 6 through 16, the method of FIG. 6 can include a step of forming a switching element on a first substrate S110, a step of forming a first insulating layer to at least partially cover the switching element S120, a step of etching the first insulating layer to form a via hole that at least partially exposes the switching element S130, a step of forming a first electrode connected to the switching element through the via hole S140, a step of forming a second insulating layer to cover the via hole, the first electrode and the first insulating layer S150, a step of etching the second insulating layer to form a spacer S160, a step of forming a light-emitting layer connected to the first electrode S170, a step of forming a second electrode connected to the light-emitting layer S180, and a step of bonding a second substrate to the first substrate S190.

Figure 7:
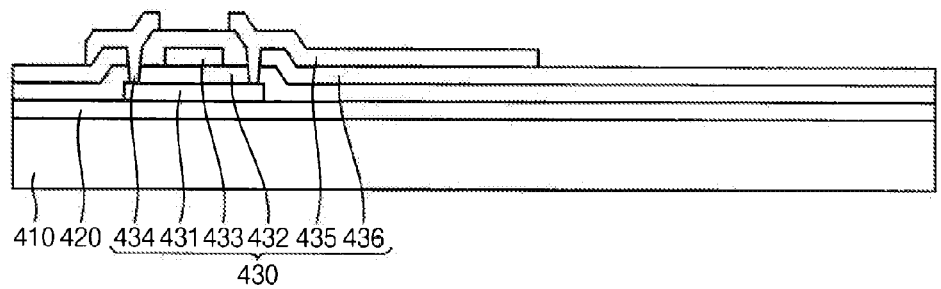
FIGS. 7 through 16 are cross-sectional views illustrating an example of the display panel manufactured by the method of FIG. 6.

As illustrated in FIG. 7, the method of FIG. 6 can form the switching element 430 on the first substrate 410. For example, the switching element 430 can be a thin film transistor (TFT). Because the switching element 430 can be formed by a well-known manufacturing process for the thin film transistor, detailed descriptions of the process will not be repeated. In some embodiments, a buffer layer 420 can be formed on the first substrate, and the switching element 430 can be formed on the buffer layer 420. The buffer layer 420 can be formed by chemical vapor deposition (CVD), atomic layer deposition (ALD), spin coating process, printing process, etc.

Figure 8:
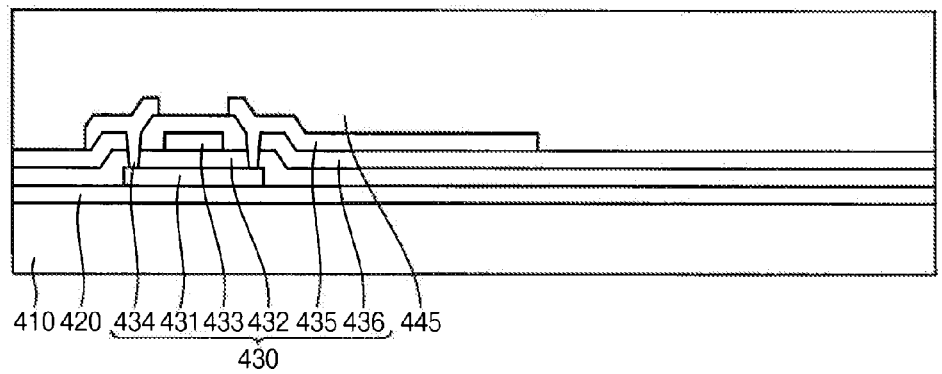

As illustrated in FIG. 8, the method of FIG. 6 can form the first insulating layer 445 to at least partially cover the switching element 430. The first insulating layer 445 can be formed of a transparent insulating material (e.g., a transparent plastic, a transparent resin, etc). The first insulating layer 445 can be formed by e.g., chemical vapor deposition, atomic layer deposition, spin coating process, printing process, etc.

Figure 9:
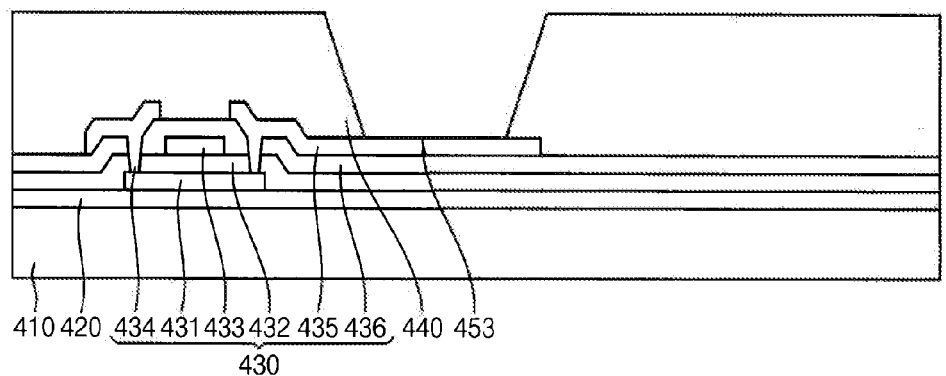

As illustrated in FIG. 9, the method of FIG. 6 can form the via hole 453 at least partially exposing the switching element 430. For example, the via hole 453 can at least partially expose a drain electrode 435 of the switching element 430. The via hole 453 can be formed by lithography. For example, the via hole 453 can be formed by forming a photoresist layer on the first insulating layer 445, disposing a mask that exposes the via hole 453, patterning the photoresist layer that is exposed through the mask, and etching the first insulating layer 445 based on patterns of the photoresist layer formed by patterning.

Figure 10:
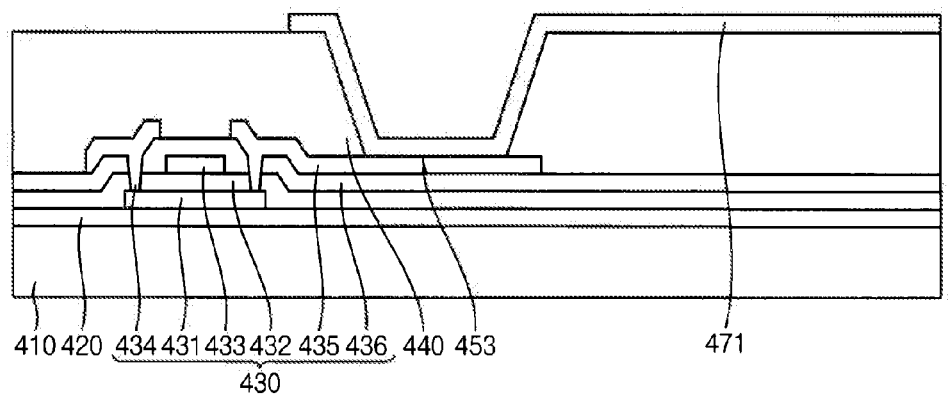

As illustrated in FIG. 10, the method of FIG. 6, can form the first electrode 471 electrically contacted to the drain electrode 435 that is exposed by the via hole 453. For example, the first electrode 471 can be formed by forming a first conductive layer using conductive material, and patterning the first conductive layer. The first conductive layer can be formed by e.g., sputtering, chemical vapor deposition, atomic layer deposition, pulsed laser deposition, printing process, etc. The first electrode 471 can be formed by lithography. In example embodiments, the method of FIG. 6 can form a conductive member filling the via hole 453, and form the first electrode 471 to be electrically connected to the conductive member.

Figure 11:
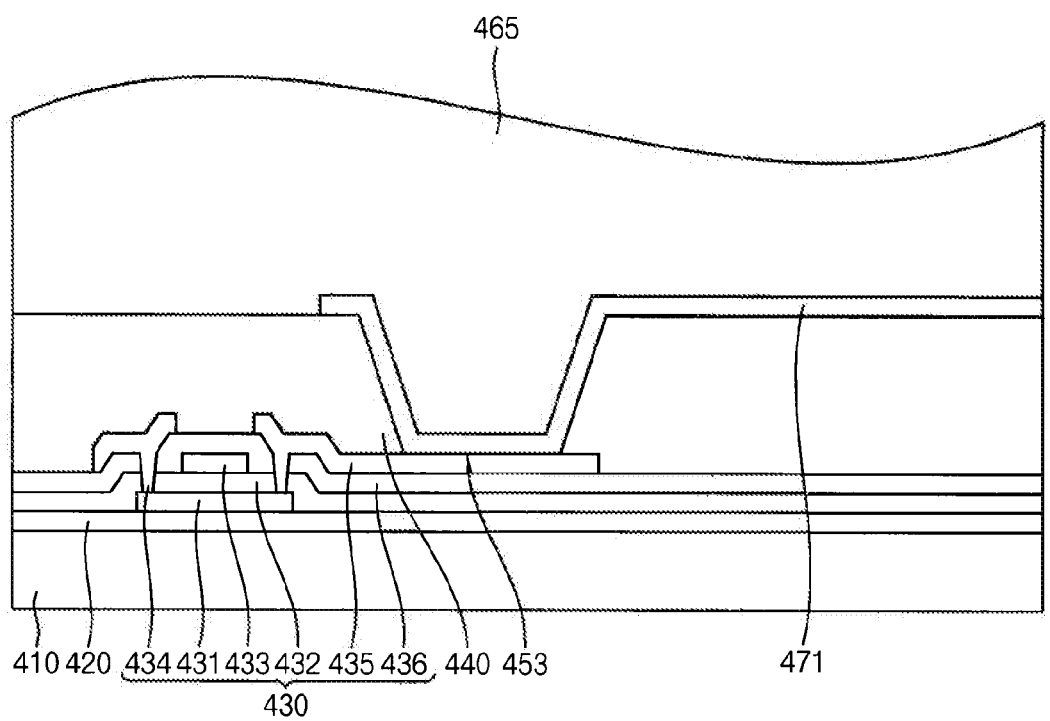

As illustrated in FIG. 11, the method of FIG. 6 can form the second insulating layer 465. The second insulating layer can be formed of an organic material (e.g., a polyacryl-based resin, an epoxy-based resin, a phenol-based resin, a polyamide-based resin, a polyimide-based resin, an unsaturated polyester-based resin, a polyphenylene-based resin, a poly (phenylenesulfide)-based resin, BCB, etc), or an inorganic material (e.g., silicon oxide, silicon nitride, silicon oxynitride, etc). For example, the second insulating layer 465 can be formed by a deposition process (e.g., chemical vapor deposition, atomic layer deposition, pulsed laser deposition, etc), sputtering, printing process, inkjet process, spin coating, etc.

Figure 12:
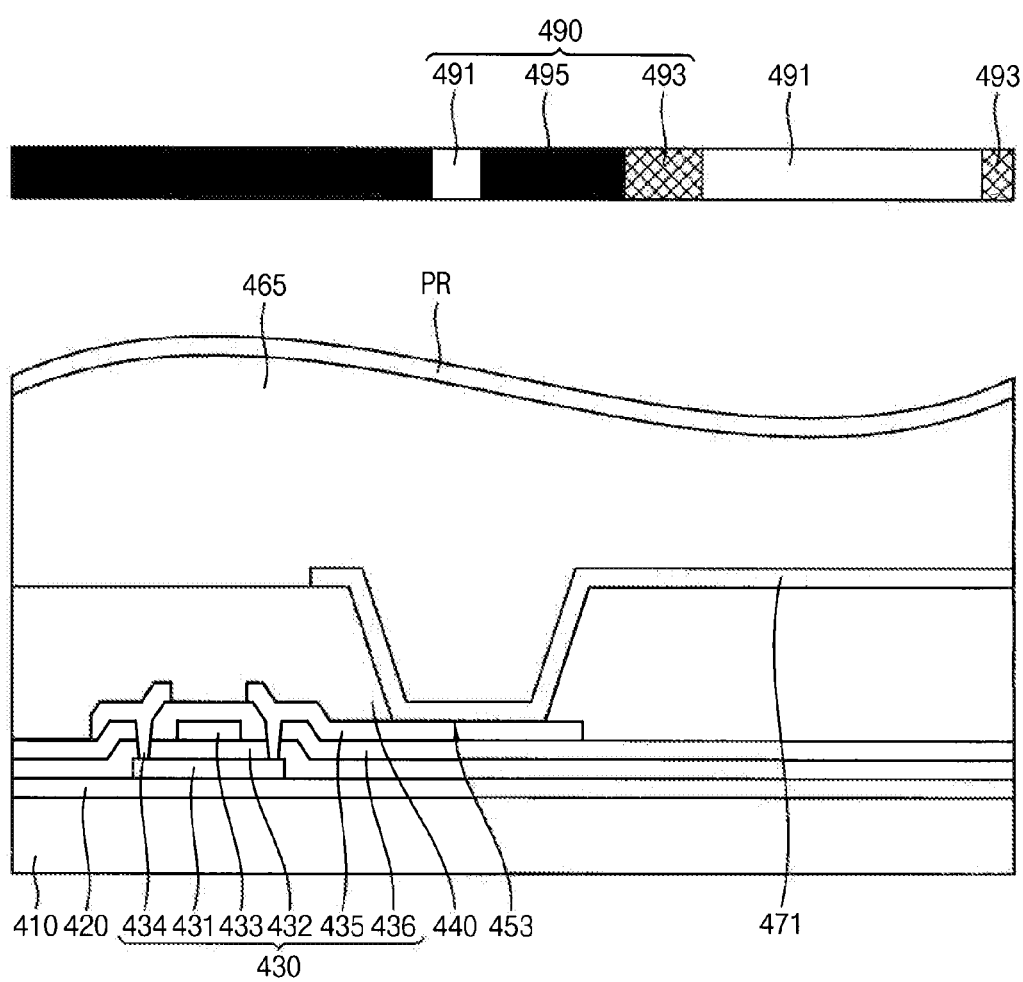

As illustrated in FIG. 12, the method of FIG. 6 can form the photoresist layer PR on the second insulating layer 465. For example, the method of FIG. 6 can coat the photoresist on the second insulating layer 465 to form the photoresist layer PR. The photoresist layer PR can be coated by e.g., spin coating, dipping method, spray coating, inkjet process, etc. The photoresist layer PR can be formed using, e.g., a positive photoresist. An exposed portion of the positive photoresist can be removed by development. The photoresist layer PR can be formed of a resin increasing a polarity by a reaction of acid. For example, the photoresist layer PR can be formed of a resin having acid resolvable protecting group, and a chemically amplified photoresist having poly alkylen glycol (PAG).

A mask 490 can be used to pattern the photoresist layer PR. For example, the mask 490 can be a half-tone mask. The half-tone mask can include a transmission region 491 that transmits the light by about 100%, a block region 495 that blocks the light by about 100% (i.e., transmits the light by about 0%), and a half-transmission region 493 that partially transmits the light. For example, the half-transmission region 493 can transmit the light by about 40% through about 70%. In some embodiments, the transmission region 491 can correspond to a region at which a pixel region DA and the trench 463 are formed, the block region 495 can correspond to a region at which a protrusion portion 461 is formed, and the half-transmission region 493 can correspond to a region at which a pixel definition portion is formed. However, when the photoresist layer PR includes a negative photoresist, the transmission region 491, the block region 495 and the half-transmission region 493 can correspond to different regions.

Figure 13:
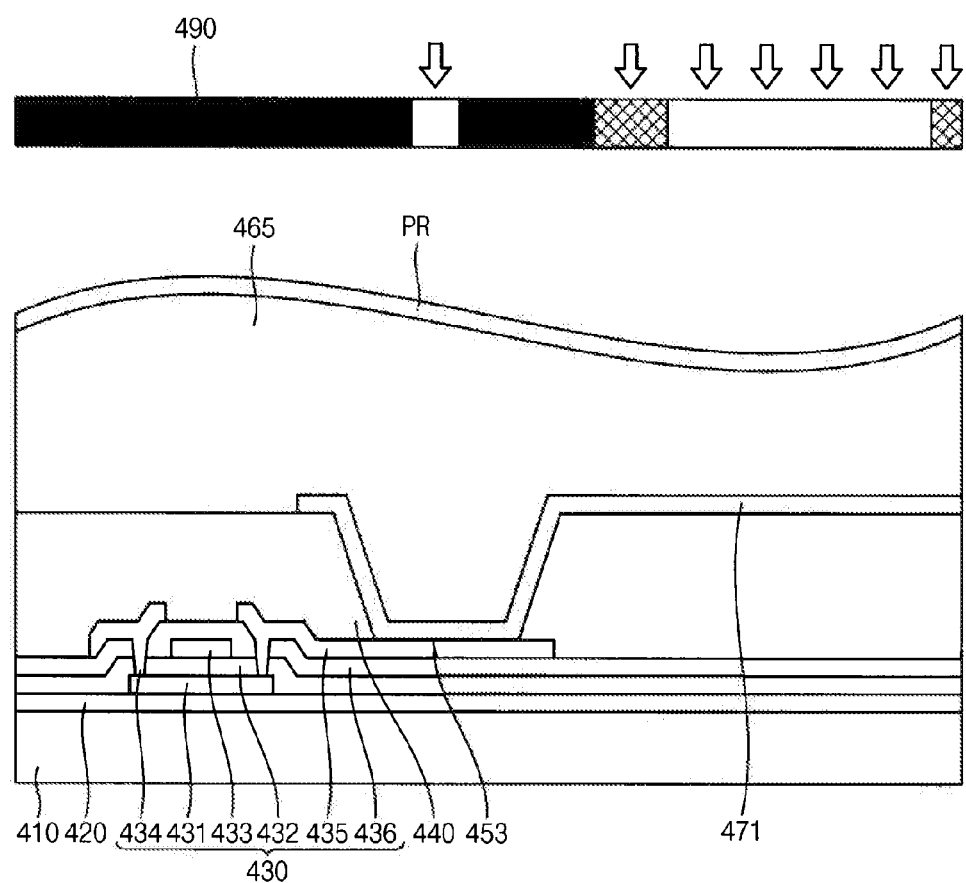

As illustrated in FIG. 13, the method of FIG. 6 can form a photoresist pattern having predetermined patterns by irradiating a light to the photoresist layer PR. The irradiating the light can be performed using, e.g., a high intensity ultraviolet ray. In some embodiments, the irradiating the light can be performed using a defocusing light of which a focal point is apart from an exposure surface (i.e., the second insulating layer 465) by a predetermined distance. In other words, the method of FIG. 6 can deliberately defocus the focal point of the light. The irradiating the light to the second insulating layer 465 can be performed using defocusing light. In example embodiments, the focal point of the light can be apart from the exposure surface by the predetermined distance ranging from about 10 μm to about 15 μm. Because the defocusing light can blur a boundary of an exposure region, the protrusion portion can be formed to have a gradual slope. However, depending on embodiments, the predetermined distance can be less than about 10 μm or greater than about 15 μm.

Figure 14:
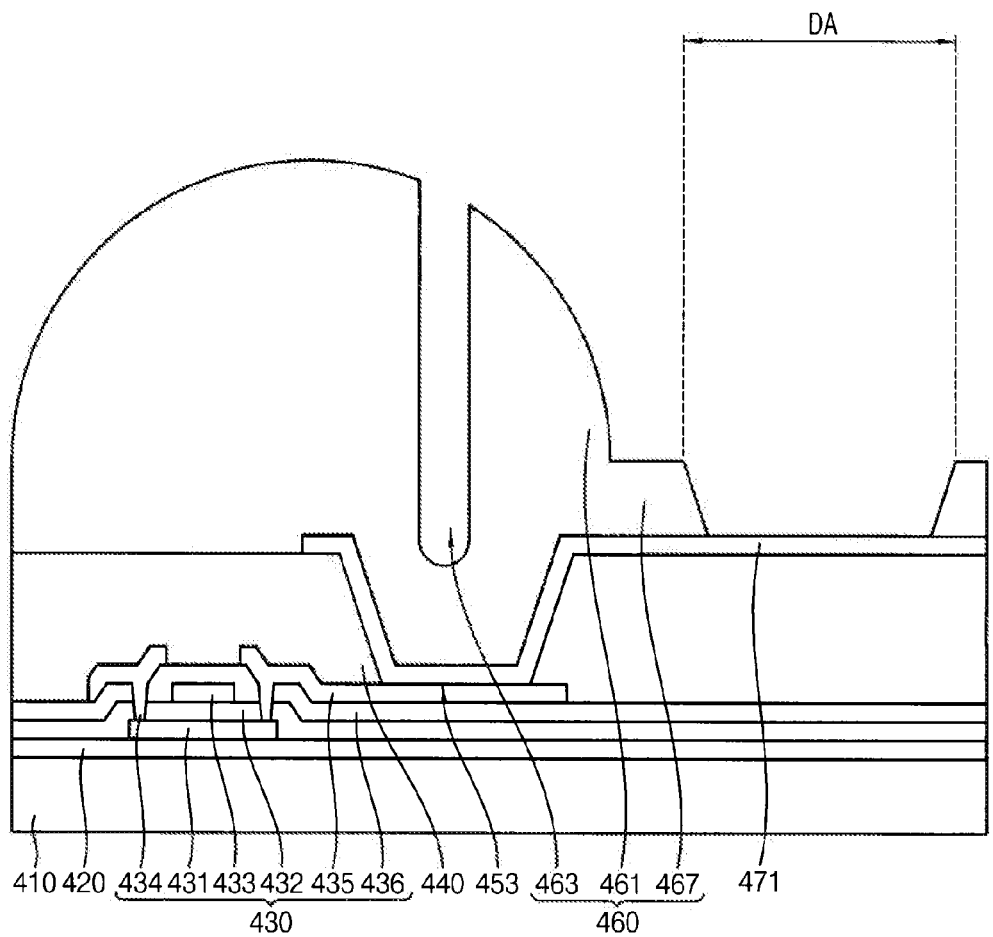

As illustrated in FIG. 14, the second insulating layer 465 can be etched based on the photoresist pattern. A portion of the second insulating layer 465 corresponding to the transmission region 491 can be deeply etched, a portion of the second insulating layer 465 corresponding to the block region 495 can be shallowly etched, and a portion of the second insulating layer 465 corresponding to the half-transmission region 493 can be moderately etched. The second insulating layer 465 can be etched by wet etching using an acidic etchant (e.g., hydrofluoric acid (HF), hydrochloric acid (HCl), etc), or dry etching using a reactive-ion or plasma. Accordingly, the pixel region DA and the trench 463 can be formed at a region corresponding to the transmission region 491, the protrusion portion 461 can be formed at a region corresponding to the block region 495 and the pixel definition portion 467 can be formed at a region corresponding to the half-transmission region 493. The protrusion portion 461, the pixel definition portion 467 and the trench 463 formed by method of FIG. 6 can respectively have different heights. In some embodiments, the method of FIG. 6 can form the protrusion portion 461 having the gradual slope by irradiating the defocusing light. In some embodiments, the trench 463 can be formed in the contact region CA from a top view of the display panel, and can be formed on the contact region CA from a cross-sectional view of the display panel.

Figure 15:
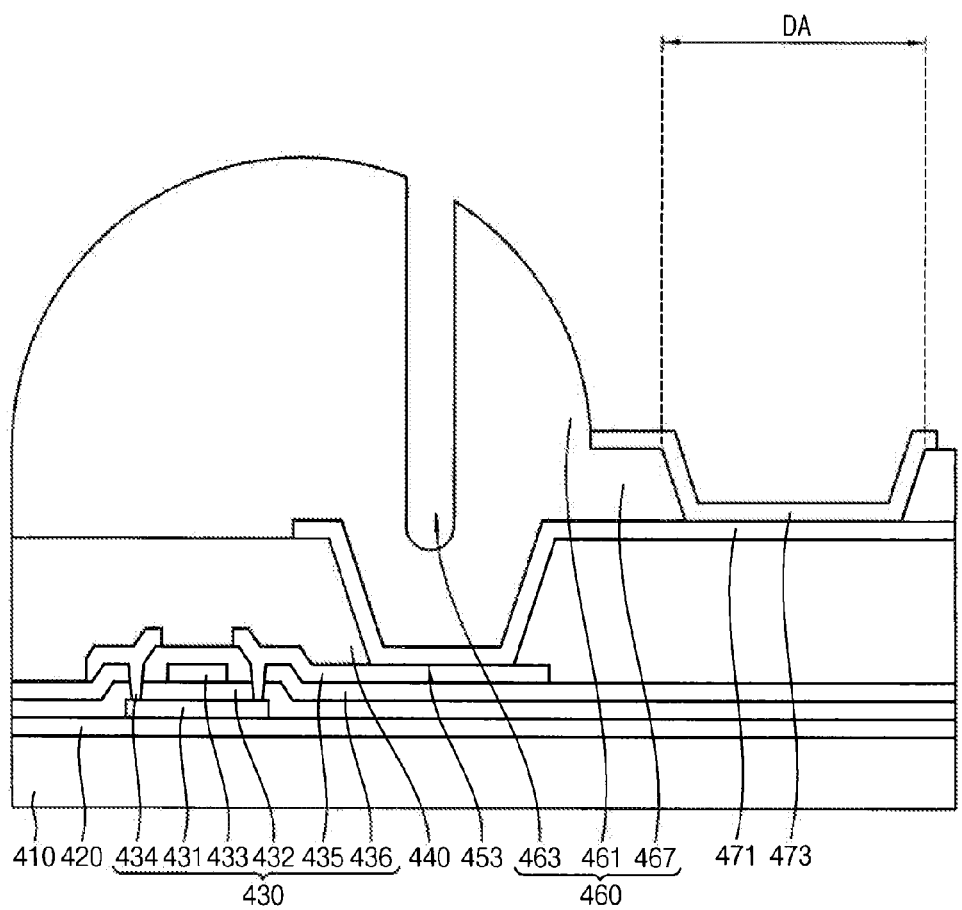

As illustrated in FIG. 15, the method of FIG. 6 can form the light-emitting layer 473 on the first electrode 471 at the pixel region DA. For example, the light-emitting layer 473 can be connected to the first electrode 471. The light-emitting layer 473 can be formed using a light-emitting host and a light-emitting dopant, and can be formed by e.g., a deposition process (e.g., chemical vapor deposition, atomic layer deposition, pulsed laser deposition, etc), sputtering, printing process, inkjet process, spin coating, etc.

Figure 16:
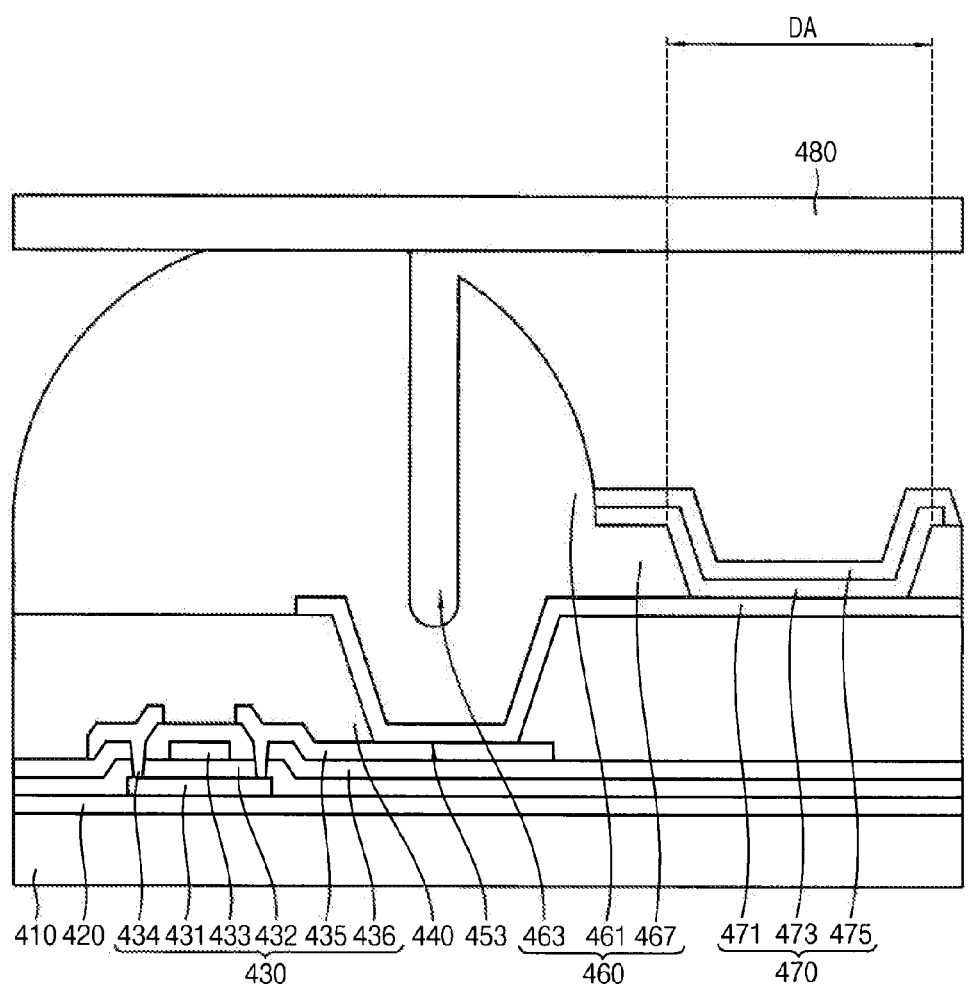

As illustrated in FIG. 16, the method of FIG. 6 can form the second electrode 475 to at least partially cover the light-emitting layer 473. Because the second electrode 475 can be formed by a forming method substantially the same as that of the first electrode 471, duplicated descriptions thereof will not be repeated.

In example embodiments, the method of FIG. 6 can form the second substrate 480 on the spacer 460 to be bonded or adhere to the first substrate 410. The second substrate 480 can be bonded or adhere to the first substrate 410 using a sealant. For example, the method of FIG. 6 can apply a sealant composition between the first substrate 410 and the second substrate 480, and can cure the sealant composition to bond the second substrate 480 to the first substrate 410 by using a light and/or a heat. The sealant composition can be applied by e.g., slit coating, spray coating, inkjet process, etc.

Therefore, the method of FIG. 6 can easily form the trench 463 that can effectively prevent the reflection of the external light by using the half-tone mask 490. Further, the method of FIG. 6 can manufacture the display panel having improved visibility.

The present inventive concept can be applied to a display device (e.g., an OLED display, an LCD, a plasma display device, an electrophoretic display device, an electrowetting display device, etc).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A display panel, comprising:
a first substrate;
a switching element formed over the first substrate;
a planarization insulating layer having a via hole that at least partially exposes the switching element;
a light-emitting structure including a first electrode connected to the switching element through the via hole;
a spacer having a trench overlapping the via hole in the depth dimension of the display panel, wherein the spacer at least partially covers the first electrode and the planarization insulating layer; and
a second substrate formed over the spacer and the light-emitting structure, wherein the spacer is interposed between the first and second substrates, and wherein the spacer is in direct physical contact with the second substrate.

2. The display panel of claim 1, wherein the trench is formed in a contact region in which the switching element contacts the first electrode.

3. The display panel of claim 2, wherein the trench is linear and has a predetermined width.

4. The display panel of claim 3, wherein the width of the trench is less than the width of the contact region.

5. The display panel of claim 4, wherein the trench is located a predetermined distance away from a boundary line of the contact region, and wherein the boundary line is formed between the trench and the remaining portion of the spacer.

6. The display panel of claim 2, wherein the trench is formed in an island shape having a predetermined area when viewed from the light-emitting side of the display panel.

7. The display panel of claim 6, wherein the area of the trench is smaller than the area of the contact region when viewed from the light-emitting side of the display panel.

8. The display panel of claim 1, wherein the trench is dented from a surface of the spacer by a predetermined depth and does not expose the first electrode.

9. The display panel of claim 1, wherein the trench is formed directly above at least a portion of the first electrode.

10. The display panel of claim 1, wherein the spacer is dome shaped.

11. A display panel, comprising:
a first substrate;
a planarization insulating layer formed over the first substrate and including a via hole;
a light-emitting structure including a first electrode;
a spacer formed over a portion of the light-emitting structure, wherein a trench is defined in the spacer and overlaps the via hole in the depth dimension of the display panel; and
a second substrate formed over the spacer and the light-emitting structure, wherein the spacer is in direct physical contact with the second substrate.

12. The display panel of claim 11, further comprising a switching element formed over the first substrate, wherein the first electrode contacts the portion, and wherein the trench is formed in a contact region in which the first electrode contacts the portion.

13. The display panel of claim 12, wherein the trench is substantially linear and has a predetermined width.

14. The display panel of claim 12, wherein the trench is formed in an island shape having a predetermined area when viewed from the light-emitting side of the display panel.

15. The display panel of claim 11, wherein the trench is dented from a surface of the spacer by a predetermined depth and does not expose the first electrode.

16. The display panel of claim 11, further comprising a pixel definition layer substantially surrounding the light-emitting structure, wherein the spacer and the pixel definition layer are formed of different materials.

17. The display panel of claim 11, further comprising a pixel definition layer substantially surrounding the light-emitting structure, wherein the spacer and the pixel definition layer are formed of the same material.

* * * * *